United States Patent
Nielsen et al.

(10) Patent No.: US 9,453,898 B2
(45) Date of Patent: Sep. 27, 2016

(54) MOTION TRACKING BASED ON FAST IMAGE ACQUISITION

(71) Applicant: KONINKLIJKE PHILIPS N. V., Eindhoven (NL)

(72) Inventors: Tim Nielsen, Hamburg (DE); Peter Boernert, Hamburg (DE); Julien Senegas, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 563 days.

(21) Appl. No.: 13/972,057

(22) Filed: Aug. 21, 2013

(65) Prior Publication Data

US 2014/0055135 A1    Feb. 27, 2014

Related U.S. Application Data

(60) Provisional application No. 61/693,408, filed on Aug. 27, 2012.

(30) Foreign Application Priority Data

Aug. 27, 2012 (EP) .................................. 12181828

(51) Int. Cl.
 *G01R 33/58* (2006.01)
 *G01R 33/565* (2006.01)
 *G01R 33/483* (2006.01)

(52) U.S. Cl.
 CPC ......... *G01R 33/58* (2013.01); *G01R 33/56509* (2013.01); *G01R 33/4835* (2013.01)

(58) Field of Classification Search
 CPC ............ G01R 33/58; G01R 33/56509; G01R 33/4835
 See application file for complete search history.

(56) References Cited

U.S. PATENT DOCUMENTS

| | | | |
|---|---|---|---|
| 5,200,700 A | 4/1993 | Glover et al. | |
| 8,126,237 B2 | 2/2012 | Kimura | |
| 8,744,154 B2 | 6/2014 | Van Den Brink | |
| 2007/0001674 A1 | 1/2007 | Purdy | |

(Continued)

FOREIGN PATENT DOCUMENTS

JP    2006304818 A  *  11/2006

OTHER PUBLICATIONS

Doneva, M., et al.; Parameter-Free Compressed Sensing Reconstruction using Statistical Non-Local Self-Similarity Filtering; 2012; ISMRM; p. 2472.

*Primary Examiner* — Rodney Bonnette

(57) ABSTRACT

A magnetic resonance imaging (MRI) system including a memory for storing machine executable instructions and a processor for controlling the magnetic resonance imaging system. The MRI system for performing a plurality of MRI scans for acquiring magnetic resonance data from a target volume of a patient in accordance with respective predefined scan geometries. The execution of the machine executable instructions causes the processor to control the MRI system to at least: perform a first calibration scan; perform a second calibration scan; generate geometry transformation data; determine a deviation of the target volume caused by a movement of the patient; update each of the predefined scan geometries and the second scan geometry as a function of the geometry transformation data; and perform at least one MRI scan of the plurality of MRI scans to acquire image data in accordance with the respective updated predefined scan geometry.

15 Claims, 5 Drawing Sheets

(56) References Cited

U.S. PATENT DOCUMENTS

| | | |
|---|---|---|
| 2008/0214923 A1 | 9/2008 | Krueger et al. |
| 2008/0253639 A1* | 10/2008 | Van Den Brink ............... G01R 33/56509 382/131 |
| 2012/0076379 A1* | 3/2012 | Dempsey ................ G06T 5/002 382/131 |
| 2013/0113486 A1* | 5/2013 | Imamura .............. G01R 33/341 324/322 |
| 2013/0200900 A1* | 8/2013 | Buurman ................ G01R 33/50 324/322 |
| 2015/0212182 A1* | 7/2015 | Nielsen ............ G01R 33/56509 702/191 |

* cited by examiner

MOTION TRACKING BASED ON FAST IMAGE ACQUISITION

CROSS REFERENCE TO RELATED APPLICATIONS

This application claims the benefit of U.S. provisional application Ser. No. 61/693,408 filed Aug. 27, 2012, and European provisional application Ser. No. 12181828.0 filed Aug. 27, 2012, both of which are incorporated herein by reference.

TECHNICAL FIELD

The invention relates to magnetic resonance imaging, in particular to motion tracking based on fast image acquisition.

BACKGROUND OF THE INVENTION

Motion during an MRI examination can seriously compromise image quality. In a typical examination, multiple scans are performed. The geometry of these scans is planned on a survey scan which is one of the first scans that is performed. If the patient moves after the acquisition of the survey scan, the scanned location is different from the planned location throughout the following part of the examination. This may lead to a bad image quality due to motion artifacts or a wrong anatomy which is imaged. As a consequence the total time of the examination is prolonged because scans need to be repeated.

T. Nielsen et al., Proc. ISMRM, p. 2472 (2012) discloses a method for rigid inter-scan motion compensation in neurological exams.

SUMMARY OF THE INVENTION

Embodiments of the invention may provide for a method for performing a plurality of MRI scans, a magnetic resonance imaging system and a computer program product.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wireline, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'processor' as used herein encompasses an electronic component which is able to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

In one aspect, the invention relates to magnetic resonance imaging system for performing a plurality of MRI scans for acquiring magnetic resonance data from a target volume of a patient in accordance with respective predefined scan geometries, wherein a scan geometry refers to positional information that describe the target volume.

The positional information comprises, for example, a center position, orientation and size (in 3D) of the target volume. The MRI system may acquire MR data in a scan geometry that corresponds with the position and orientation of the target volume. The position and orientation may be defined relative to a coordinate system such as a patient-based coordinate system. The position may refer to the origin of the target volume with respect to a coordinate system such as the patient-based coordinate system. The orientation may be a sagittal, coronal, axial or an oblique orientation of the target volume. One or more scan geometries may be defined for the same position of the target volume. The slices and target volume position and orientation are defined in a common coordinate system.

The plurality of MRI scans may be performed during an MRI examination and may be followed and/or preceded by other MRI scans during the same MRI examination. The plurality of MRI scans may be performed for diagnostic purposes.

The magnetic resonance imaging system comprises a memory for storing machine executable instructions and a processor for controlling the magnetic resonance imaging system, wherein execution of the machine executable instructions causes the processor to perform the step a) of controlling the MRI system to perform a first calibration scan for acquiring first image data from the target volume in accordance with a first scan geometry, wherein the first calibration scan comprises a first set of two-dimensional scans performed in respective first crossing slices, wherein the first set of two dimensional scans comprises at least two two-dimensional scans.

The first calibration scan may be used as a reference scan. The acquisition of the first image data is performed in accordance with the first scan geometry that defines a reference position and orientation of the target volume relative to a coordinate system such as the patient-based coordinate system. The first scan geometry may comprise one of the predefined scan geometries of the plurality of MRI scans. For example, the crossing angle of the at least two first crossing slices may be equal to 90°.

The at least two first crossing slice planes of the target volume may be first selected. This may be done by exciting the magnetic spins in each slice plane of the target volume by a coincident combination of a gradient magnetic field and a slice selective RF pulse at a specific Larmor frequency. The magnetic field gradient is applied perpendicular to the slice plane which is added to the main static magnetic field B0. Furthermore, phase encoding magnetic field gradient pulses are produced for each of the slice planes and a readout magnetic field gradient pulse is produced at each of echo signal times.

The execution of the machine executable instructions causes the processor to perform the step b) of controlling the MRI system to perform a second calibration scan comprising a second set of two-dimensional scans performed in respective second crossing slices to acquire second image data in accordance with a second scan geometry.

The second crossing slices are positioned relative to the first crossing slices such that a registration of the first and second image data may be performed. The second scan geometry is associated with a position and orientation of the target volume.

The execution of the machine executable instructions causes the processor to perform the step c) of generating geometry transformation data by registering the second image data relative to the first image data.

The geometry transformation data may relate to a change between a first scan geometry of the first calibration scan associated with a position and orientation of the target volume and a second scan geometry of the second calibration scan associated with the position and orientation of the target volume.

The geometry transformation data may be indicative of motion amounts as well as the type of motion. For example, the geometry transformation data may represent a rotation matrix in case of a rotation movement of the patient and/or a translation vector in case of a translation movement. The transformation data may map the coordinates of the second image to that of the first image; which may be then used to update the second scan geometry as well as each of the predefined scan geometries such that it corrects for the patient motion.

The execution of the machine executable instructions causes the processor to perform the step d) of determining a deviation of the target volume caused by a movement of the patient using the geometry transformation data.

For example, the movement of the patient may be a head movement and/or a movement of the heart due to respiration. The deviation may describe an amount of the patient's movement. For example, the deviation caused by a translation movement along an axis may describe a shift of the second image data with respect to the first image data of few mm along that axis.

The execution of the machine executable instructions causes the processor to perform the step e) of updating each of the predefined scan geometries and the second scan geometry as a function of the geometry transformation data.

This has the effect of correcting for the detected motion such that in a next iteration the second calibration scan may be performed using the updated second scan geometry. As soon as this process converges, the MRI scan used for diagnostic purpose may use the updated predefined scan geometry which is associated with the new position of the target volume.

The execution of the machine executable instructions causes the processor to perform the step f) of repeating steps b to e until a termination criterion has been satisfied.

This loop may continue until the termination criterion has been satisfied, and may be performed in one or more iterations.

The execution of the machine executable instructions causes the processor to perform the step g) of controlling the MRI system to perform at least one MRI scan of the plurality of MRI scans to acquire image data in accordance with the respective updated predefined scan geometry.

The first calibration scan may be performed before performing the at least one MRI scan. The second calibration scans may be performed before each at least one MRI scan of the plurality of MRI scans.

The execution of the machine executable instructions causes the processor to perform the step h) of repeating steps b-g for performing the plurality of MRI scans.

These features may be advantageous, as they provide a precise estimation of the target volume position during the entire examination. This may ensure a consistent scan geometry during the entire examination, which is important if results from different scans are to be compared. Also, the convergence speed of the method may be increased by performing repeated calibration scans with a variable number of slices.

Another advantage may be that they may shorten the duration of the examination as they avoid repeated diagnostic MRI scans that would otherwise be required in case the detection and correction of the motion is not used or it is not precisely performed.

A further advantage may be that these features may be applied to compensate for motion in a diagnostic examination such as a neurological examination as well as in interventional applications during which, the patient may be moved several times into and out of the bore, and thus requiring a robust and automatic method to compensate for these changes.

According to one embodiment, the step d) further comprises the step of determining slices of the second set of two-dimensional scans based on the geometry transformation data.

After the first repetition of the steps b to e, the second set of two-dimensional scans may comprise a number $N_2$ of two-dimensional scans, with $0 \leq N_2 \leq N_1$ and $N_1$ is the number of two-dimensional scans (i.e. the at least two first crossing slices) performed in the first calibration scan. $N_2$ may be determined depending on the movement of the patient. For example, in case of a translation movement of the patient along an axis $N_2$ may be equal to 1. That is, only the slice which is parallel to the axis is required for determining the new position of the target volume in a next iteration.

According to one embodiment, the termination criterion comprises: the deviation is below a predetermined first threshold value.

The termination criterion may further comprise: Number of iterations is above a repetition threshold and/or time spent for steps b)-e) is above a time threshold.

According to one embodiment, in case the deviation is caused by a translation movement of the patient along an axis, determining the slice parallel to the axis as a slice of the second set of crossing slices, wherein the first threshold value is a maximum allowed translation distance.

According to one embodiment, in case the deviation is caused by a patient movement combining a translation along a first axis and a rotation movement around a second axis, determining the slices parallel to the first axis and perpendicular to the second axis as slices of the second set of crossing slices, wherein the first threshold value comprises a maximum allowed translation distance and a maximum allowed rotation angle.

These embodiments may be advantageous in that they detect and correct for the motion in an optimal manner by using only the required slices for determining the motion. That is, each iteration scan may be performed with a different number of slices that is dynamically determined depending on the patient motion. This may also fasten the iterative process to quickly converge.

According to one embodiment, the repeating of steps b to e is performed in one or more iterations, wherein the second set of two dimensional slices in the first iteration comprises at least two crossing slices.

That is, the number and positioning of the slices in the second calibration scan may be the same as the one of the first calibration scan. This may be advantageous as it may facilitate the detection of the patient movement by comparing image data taken in similar slices. This may have also the advantage of providing a reliable starting seed of the iteration process which may further speed up the convergence of the iterative process.

According to one embodiment, the repeating of the steps b to e happens during the at least one MRI scan.

According to one embodiment, the execution of the machine executable instructions further causes the processor to control the MRI system to acquire the first image data at a first image resolution and the second image data at a second image resolution which is different than the first image resolution.

The second image resolution may be lower than the first image resolution, because the first image resolution is required for defining a precise initial position of the target volume. This may have the advantage of reducing the overall speed of the examination process while still providing a reliable detection and correction motion method.

According to one embodiment, the repeating of steps b to e is performed in one or more iterations, wherein for each iteration of the one or more iterations the execution of the machine executable instructions further causes the processor to acquire the second image data at a different image resolution.

For example, the image resolution may be increased with increasing number of iterations such that in the first iteration a global behavior of the motion may be determined (in a quasi-qualitative manner), and then a better resolution is used in order to precisely quantify the motion of the patient.

According to one embodiment, in case the deviation is higher than the first threshold value and smaller than a second threshold value, acquiring the second image data at a third image resolution which is higher than the second image resolution.

This may be advantageous in that a user of the MRI system may control the acquisition at different image resolutions based on his/her criteria. For example, the second threshold value may be chosen such that the resolution is only changed when the deviation becomes very small, that is more image details are required for motion detection and correction.

According to one embodiment, the first threshold value being determined based on a similarity criterion between the first image data and second image data acquired in a pre-scan by the MRI system.

This may be done, for example, by comparing two image data acquired at different time from a patient being motionless and comparing the two images to define how similar are. The determination of the first threshold value may take into account the fact that the two images may have differences although there is no motion due to different induced streaking artifacts that may affect the two images.

According to one embodiment, the MRI system further comprises a plurality of RF transmit and/receive coils, wherein the execution of the machine executable instructions further causes the processor to re-measure the spatial sensitivity profiles of the RF coils and/or to re-compute the spatial sensitivity profiles of the RF coils based on the deviation.

This may be advantageous in that the system may be fully integrated into the workflow similar to a scan preparation phase (i.e. without user interaction).

According to one embodiment, the first and second crossing slices are orthogonal slices.

According to one embodiment, the first crossing slices comprise sagittal, coronal and axial slices.

By using more than 3 orthogonal slices in each of the calibration scans, e.g. 3×3 slices, non-rigid deformations may be determined. This may be of particular interest for knee imaging, if the knee is to be imaged in two bending states.

In another aspect, the invention relates to a method for performing a plurality of MRI scans for acquiring magnetic resonance data from a target volume of a patient in accordance with respective predefined scan geometries, wherein a scan geometry refers to positional information that describe the target volume, the method comprising:

a. performing a first calibration scan for acquiring first image data from the target volume in accordance with a first scan geometry, wherein the first calibration scan comprises a first set of two-dimensional scans performed in respective first crossing slices, wherein the first set of two dimensional scans comprises at least two two-dimensional scans;

b. performing a second calibration scan comprising a second set of two-dimensional scans performed in respective second crossing slices to acquire second image data in accordance with a second scan geometry;

c. generating geometry transformation data by registering the second image data relative to the first image data;

d. determining a deviation of the target volume caused by a movement of the patient using the geometry transformation data;

e. updating each of the predefined scan geometries and the second scan geometry as a function of the geometry transformation data;

f. repeating steps b to e until a termination criterion has been satisfied;

g. controlling the MRI system to perform at least one MRI scan of the plurality of MRI scans to acquire image data in accordance with the respective updated predefined scan geometry; and h. repeating steps b-g for performing the plurality of MRI scans.

In another aspect, the invention relates to a computer program product comprising computer executable instructions to perform the method steps of the method described above.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

In the following, like numbered elements in the figures are either similar elements or perform an equivalent function. Elements which have been discussed previously will not necessarily be discussed in later figures if the function is equivalent.

Various structures, systems and devices are schematically depicted in the figures for purposes of explanation only and so as to not obscure the present invention with details that are well known to those skilled in the art. Nevertheless, the attached figures are included to describe and explain illustrative examples of the disclosed subject matter.

Figure 1:
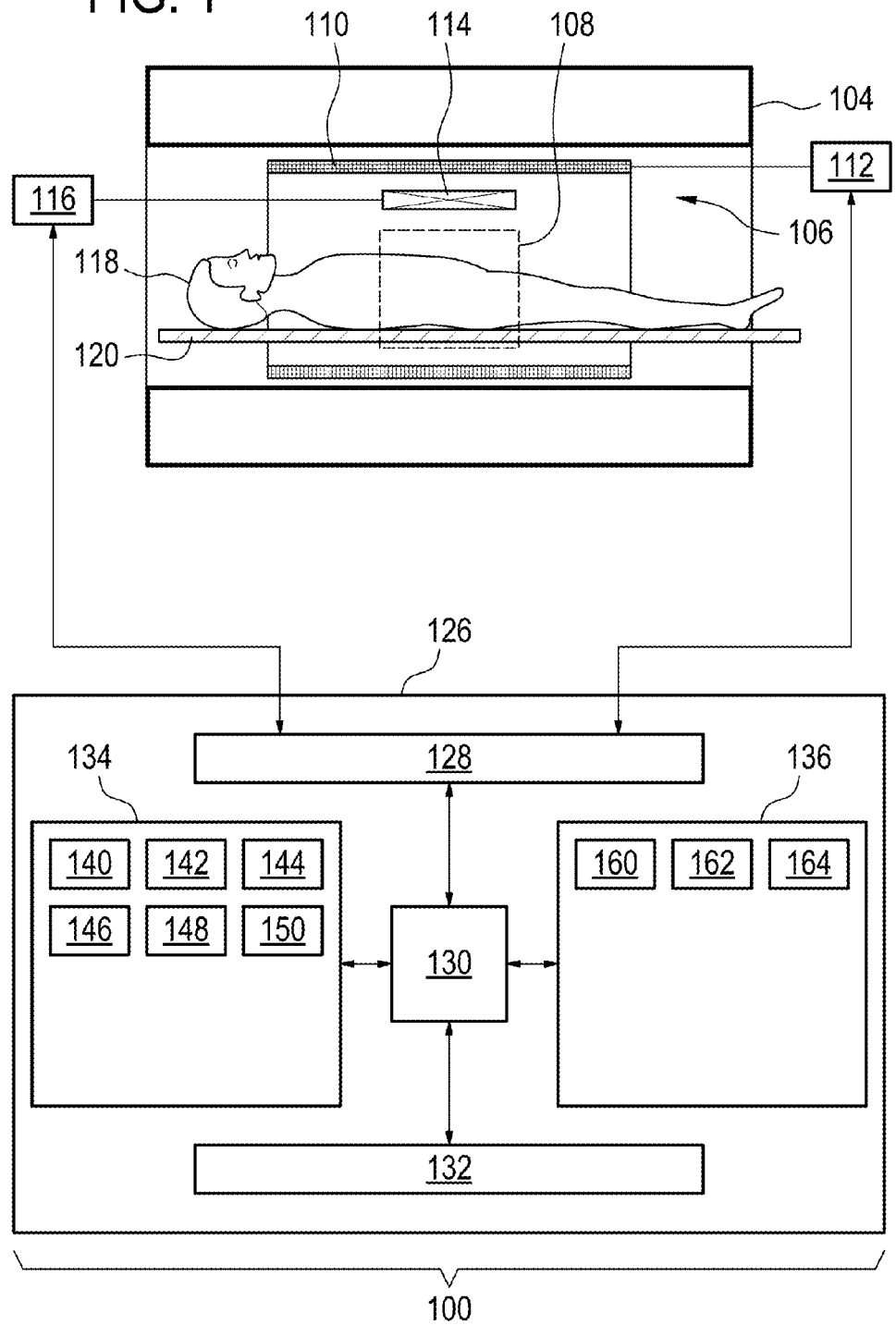
FIG. 1 illustrates a magnetic resonance imaging system.

FIG. 1 illustrates an example of a magnetic resonance imaging system 100. The magnetic resonance imaging system 100 comprises a magnet 104. The magnet 104 is a superconducting cylindrical type magnet 104 with a bore 106 through it. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receivers.

The magnetic field gradient coil power supply 112 and the transceiver 116 are connected to a hardware interface 128 of computer system 126. The computer system 126 further comprises a processor 130. The processor 130 is connected to the hardware interface 128, a user interface 132, computer storage 134, and computer memory 136.

The computer storage 134 is shown as containing first image data 140 and second image data 142. The first and second image data are acquired from a target volume of the imaging zone 108 by the MRI system 100 at different time. The computer storage 134 is further shown as containing geometry transformation data 144 being generated by registering the second image data 142 relative to the first image data 140. The computer storage 134 is further shown as containing first scan geometry 146, second scan geometry 148 and plurality of predefined scan geometries 150.

The computer memory 136 is shown as containing a control module 160. The control module 160 contains computer-executable code which enables the processor 130 to control the operation and function of the magnetic resonance imaging system 100. It also enables the basic operations of the magnetic resonance imaging system 100 such as the acquisition of magnetic resonance data. The processor 130 uses the control module 160 and the first and second scan geometries 146, 148 to acquire the first and second image data 140, 142.

The computer memory 136 is further shown as containing a registering module 162. The registering module 162 contains computer-executable code which enables the processor 130 to generate the geometry transformation data by registering the first image data relative to the second image data.

The computer memory 136 is further shown as containing an updating geometry module 164. The updating geometry module 164 contains computer-executable code which enabled the processor 130 to update each of the plurality of predefined scan geometries 150 and the second scan geometry 148 as a function of the geometry transformation data 144.

Figure 2:
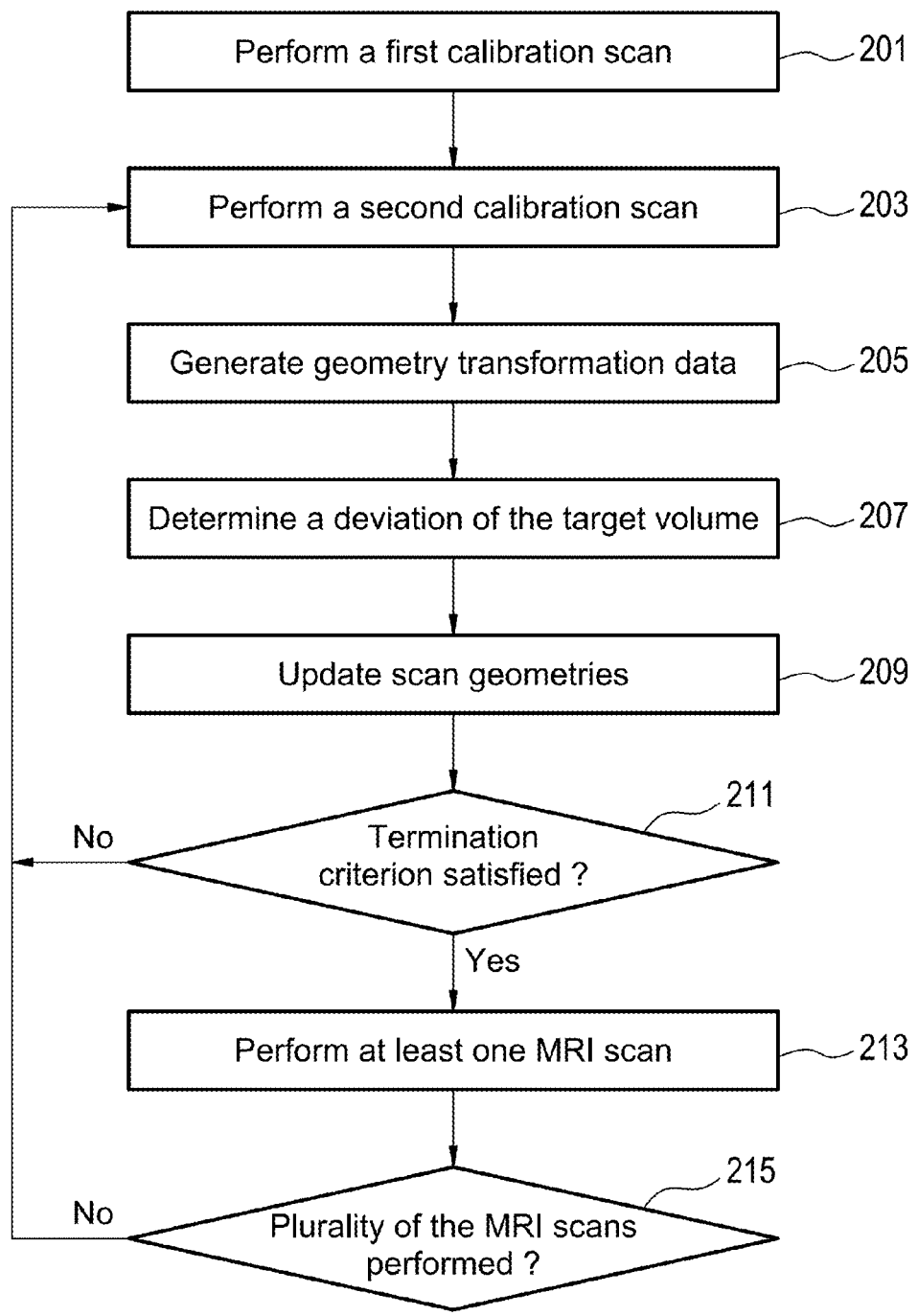
FIG. 2 shows a flowchart of a method for performing a plurality of MRI scans.

For the purpose of explanation, the method described in FIG. 2 can be implemented in the MRI system in FIG. 1, but is not limited to this implementation. Therefore, reference numerals from FIG. 1 are not necessarily used in FIG. 2.

FIG. 2 is a flowchart of a method for performing by a MRI system a plurality of MRI scans for acquiring magnetic resonance data from a target volume of a patient in accordance with respective predefined scan geometries. The scan geometry refers to positional information that describe the target volume. The target volume may be the head of the patient.

Figure 3:
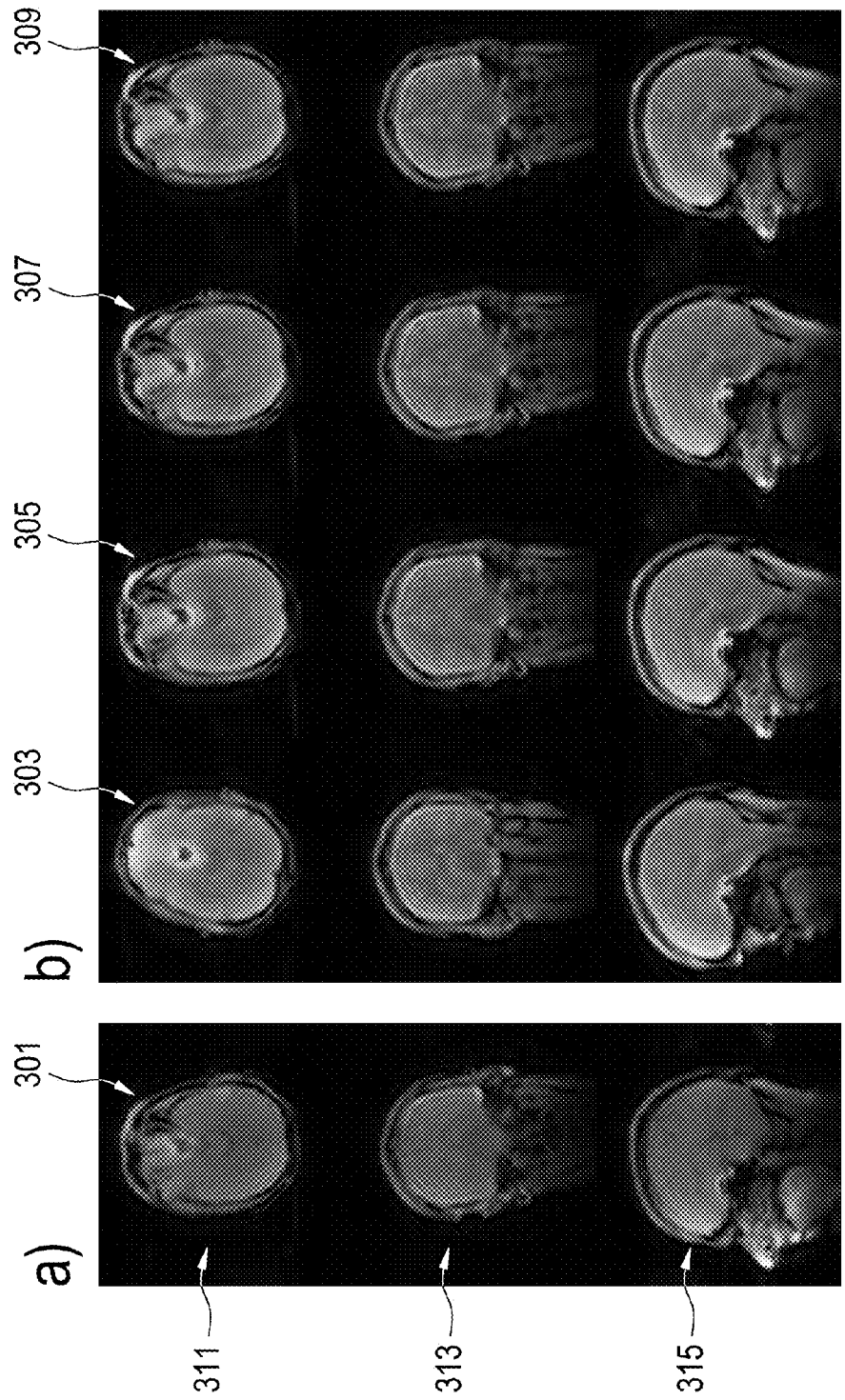
FIG. 3 shows a series of three orthogonal slices of a patient's head.

In step 201, a first calibration scan is performed for acquiring first image data from the target volume in accordance with a first scan geometry. The first calibration scan comprises a first set of two-dimensional scans performed in respective first crossing slices, wherein the first set of two dimensional scans comprises at least two two-dimensional scans. The first crossing slices may be orthogonal slices. For example, the first crossing slices comprise sagittal, coronal and axial slices as shown in FIG. 3.

In step 203, a second calibration scan is performed. The second calibration scan comprises a second set of two-dimensional scans performed in respective second crossing slices to acquire second image data in accordance with a second scan geometry. The first image data and the second image data may be acquired at different image resolutions. For example, the first image resolution is higher than the second image resolution.

In step 205, geometry transformation data are generated by registering the second image data relative to the first image data.

In step 207, a deviation of the target volume is determined using the geometry transformation data. The deviation is caused by a movement of the patient. The second set of two-dimensional scans may be determined based on the deviation. For example, in case the deviation is caused by a translation movement of the patient along an axis, the slice parallel to the axis is determined as a slice of the second set of crossing slices. In case the deviation is caused by a patient movement combining a translation along a first axis and a rotation movement around a second axis, the slices parallel to the first axis and perpendicular to the second axis are determined as slices of the second set of crossing slices.

In step 209, each of the predefined scan geometries and the second scan geometry are updated as a function of the geometry transformation data.

Step 211 is a question box, if the deviation is above a predetermined first threshold value the method proceeds back to step 203 and the method proceeds again through steps 203, 205, 207, 209 and 211. This loop continues until a termination criterion has been satisfied. The termination criterion comprises the deviation is below the first predetermined threshold value, number of iterations is above a repetition threshold, time spent for steps 203-209 is above a time threshold and/or a combination thereof. This loop is performed in one or more iterations, wherein the second set of two dimensional slices in the first iteration comprises at least two crossing slices. For each iteration of the one or more iterations the second image data are acquired at a different image resolution. In case of a translation movement of the patient, the first predetermined threshold value is a maximum allowed translation distance. In case the deviation is caused by a patient movement combining a translation along and a rotation movement, the first threshold value comprises a maximum allowed translation distance and a maximum allowed rotation angle. The first threshold value being determined based on a similarity criterion between the first image data and second image data acquired in a pre-scan by the MRI system.

For example, the first threshold value may be set to 2 mm for abdominal imaging. The first threshold value may also depend on the resolution (or other properties) of the clinical scan that is performed after the calibration scans. For example, if a following scan has a spatial resolution of 5 mm it is good enough to correct for motion in this order of magnitude. Also scans that have very low geometric fidelity like EPI could have relaxed thresholds.

If the deviation is below the predetermined first threshold value the method proceeds to step 213 to perform at least one MRI scan of the plurality of MRI scans to acquire image data. Step 215 is a question box, if the plurality of the MRI scans are not all performed the method proceeds back to step 203 and the method proceeds again through steps 203, 205, 207, 209, 211, 213 and 215. This loop continues until the plurality of the MRI scans is performed.

Figure 4:
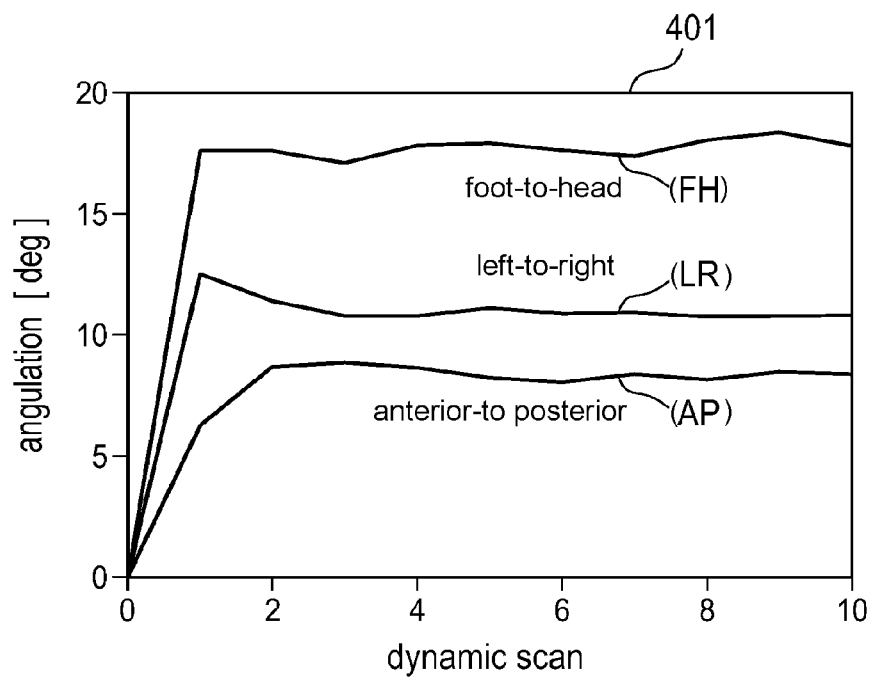
FIG. 4 shows the estimated off-center and angulation for each cycle of the motion quantification.
Figure 4:
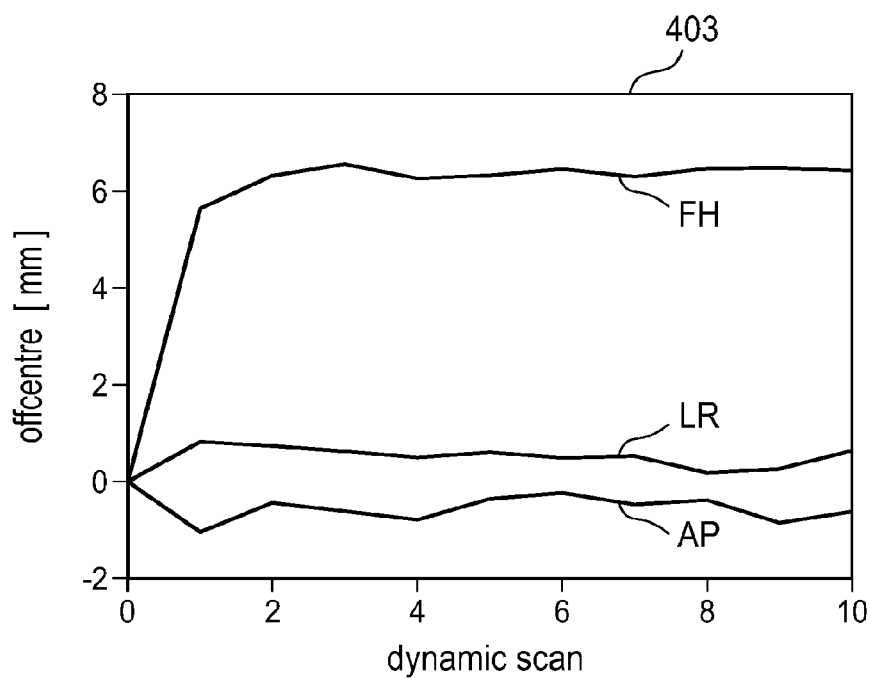

An example implementation of the iterative motion compensation method is described in details in the following paragraphs. A balanced fast field echo (FFE) sequence may be used and defining the main imaging parameters as follows: FOV of 270.times.270 mm.sup.2, 64.sup.2 matrix, slice thickness 20 mm, half-Fourier acquisition, flip angle 15.degree., TR/TE 1.93/0.96 ms, 5 start-up echoes. FIG. 3 shows a typical set of reference images 301 acquired with a first calibration scan in a set of three orthogonal slices 311, 313 and 315 which serve as reference for the patient position. FIG. 3 further shows a series of orthogonal slices acquired during the iterative motion quantification and correction. The first 4 iterations 303, 305, 307 and 309 of the position finding scan after motion are acquired with the second calibration scan. After the first update of the second scan geometry a significant change in the head orientation between the first 303 and second column 305 i.e. first and second iteration. Most of the motion is corrected for after the first geometry update. FIG. 4 shows the estimated angulation 401 and off-center 403 after each iteration of the motion quantification and correction. This also demonstrates the quick convergence of the iteration process. The off-center refers to the shifting of the center of a slice from the center of the magnetic field defined by the set of gradient coils.

Figure 5:
FIG. 5 shows images resulting from resulting from three diagnostic MRI scans before and after motion correction.

FIG. 5 shows the impact of the motion compensation on a diagnostic scan before motion 501, the same scan as 501 after motion 503 but without correction and a scan after motion but with correction 505. The close agreement of 501 and 505 shows the effectiveness of the method.

A particular advantage of the method is that it is very quick and that it can be fully integrated into the workflow similar to a scan preparation phase (i.e. without user interaction). For example, for a set of three 64×64 slices may be acquired in 280 ms. i.e., the whole motion quantification in the iteration process may be executed in approx. 1 s.

The invention claimed is:

1. A magnetic resonance imaging (MRI) system for performing a plurality of MRI scans for acquiring magnetic resonance data from a target volume of a patient in accordance with respective predefined scan geometries, wherein a scan geometry refers to positional information that describes the target volume, the magnetic resonance imaging system comprising a non-transitory memory for storing machine executable instructions and a processor for controlling the magnetic resonance imaging system, wherein execution of the machine executable instructions causes the processor to:
 a. control the MRI system to perform a first calibration scan for acquiring first image data from the target volume in accordance with a first scan geometry, wherein the first calibration scan comprises a first set of two-dimensional scans performed in respective first crossing slices, wherein the first set of two dimensional scans comprises at least two two-dimensional scans;
 b. control the MRI system to perform a second calibration scan comprising a second set of two-dimensional scans performed in respective second crossing slices to acquire second image data of the target volume in accordance with a second scan geometry;
 c. generate geometry transformation data by registering the second image data relative to the first image data;
 d. determine a deviation of the target volume caused by a movement of the patient using the geometry transformation data;
 e. update each of the predefined scan geometries and the second scan geometry as a function of the geometry transformation data;
 f. repeat steps b to e until the determined deviation of the target volume satisfies a termination criterion;
 g. control the MRI system to perform at least one MRI scan of the plurality of MRI scans to acquire image data in accordance with the respective updated predefined scan geometry; and
 h. repeat steps b to g for performing the plurality of MRI scans.

2. The magnetic resonance imaging system of claim 1, wherein the step d further comprises the step of determining slices of the second set of two-dimensional scans based on the geometry transformation data.

3. The magnetic resonance imaging system of claim 1, wherein the repeating of the steps b to e happens during the at least one MRI scan.

4. The magnetic resonance imaging system of claim 1, wherein the termination criterion comprises: the deviation is below a predetermined first threshold value.

5. The magnetic resonance imaging system of claim 4, wherein in case the deviation is caused by a translation movement of the patient along an axis, determining the slice parallel to the axis as a slice of the second set of crossing slices, wherein the first threshold value is a maximum allowed translation distance.

6. The magnetic resonance imaging system of claim 4, wherein in case the deviation is caused by a patient movement combining a translation along a first axis and a rotation movement around a second axis, determining the slices parallel to the first axis and perpendicular to the second axis as slices of the second set of crossing slices, wherein the first threshold value comprises a maximum allowed translation distance and a maximum allowed rotation angle.

7. The magnetic resonance imaging system of claim 4, the first threshold value being determined based on a similarity criterion between the first image data and second image data acquired in a pre-scan by the MRI system.

8. The magnetic resonance imaging system of claim 1, wherein the repeating of steps b to e is performed in one or more iterations, wherein the second set of two dimensional slices in the first iteration comprises at least two crossing slices.

9. The magnetic resonance imaging system of claim 1, wherein the MRI system further comprises a plurality of RF transmit and/or receive coils, wherein the execution of the machine executable instructions further causes the processor to re-measure the spatial sensitivity profiles of the RF coils and/or to re-compute spatial sensitivity profiles of the RF coils based on the deviation.

10. The magnetic resonance imaging system of claim 1, wherein the first and second crossing slices are orthogonal slices.

11. The magnetic resonance imaging system of claim 1, wherein the first crossing slices comprises sagittal, coronal and axial slices.

12. A magnetic resonance imaging (MRI) system for performing a plurality of MRI scans for acquiring magnetic resonance data from a target volume of a patient in accordance with respective predefined scan geometries, wherein a scan geometry refers to positional information that describes the target volume, the magnetic resonance imaging system comprising a non-transitory memory for storing machine executable instructions and a processor for controlling the magnetic resonance imaging system, wherein execution of the machine executable instructions causes the processor to:
  a. control the MRI system to perform a first calibration scan for acquiring first image data from the target volume in accordance with a first scan geometry, wherein the first calibration scan comprises a first set of two-dimensional scans performed in respective first crossing slices, wherein the first set of two dimensional scans comprises at least two two-dimensional scans;
  b. control the MRI system to perform a second calibration scan comprising a second set of two-dimensional scans performed in respective second crossing slices to acquire second image data in accordance with a second scan geometry;
  c. generate geometry transformation data by registering the second image data relative to the first image data;
  d. determine a deviation of the target volume caused by a movement of the patient using the geometry transformation data;
  e. update each of the predefined scan geometries and the second scan geometry as a function of the geometry transformation data;
  f. repeat steps b to e until a termination criterion has been satisfied;
  g. control the MRI system to perform at least one MRI scan of the plurality of MRI scans to acquire image data in accordance with the respective updated predefined scan geometry; and
  h. repeat steps b to g for performing the plurality of MRI scans,
wherein the execution of the machine executable instructions further causes the processor to control the MRI system to acquire the first image data at a first image resolution and the second image data at a second image resolution which is different than the first image resolution.

13. The magnetic resonance imaging system of claim 12, wherein the repeating of steps b to e is performed in one or more iterations, wherein for each iteration of the one or more iterations the execution of the machine executable instructions further causes the processor to acquire the second image data at a different image resolution.

14. A method for performing a plurality of magnetic resonance imaging (MRI) scans for acquiring magnetic resonance data from a target volume of a patient in accordance with respective predefined scan geometries, wherein a scan geometry refers to positional information that describes the target volume, the method comprising:
  a. performing a first calibration scan for acquiring first image data from the target volume in accordance with a first scan geometry, wherein the first calibration scan comprises a first set of two-dimensional scans performed in respective first crossing slices, wherein the first set of two dimensional scans comprises at least two two-dimensional scans;
  b. performing a second calibration scan comprising a second set of two-dimensional scans performed in respective second crossing slices to acquire second image data from the target volume in accordance with a second scan geometry;
  c. generating geometry transformation data by registering the second image data relative to the first image data;
  d. determining a deviation of the target volume caused by a movement of the patient using the geometry transformation data;
  e. updating each of the predefined scan geometries and the second scan geometry as a function of the geometry transformation data;
  f. repeating steps b to e until the determined deviation of the target volume satisfies a termination criterion;
  g. controlling the MRI system to perform at least one MRI scan of the plurality of MRI scans to acquire image data in accordance with the respective updated predefined scan geometry; and
  h. repeating steps b-g for performing the plurality of MRI scans.

15. A computer program product comprising computer executable instructions to perform the method steps of the method of claim 14.

* * * * *